May 28, 1968 J. J. FRANTZEN 3,385,773
PROCESS FOR MAKING SOLID ELECTRICAL CONNECTION THROUGH
A DOUBLE-SIDED PRINTED CIRCUIT BOARD
Filed May 28, 1965

INVENTOR.
JOHN J. FRANTZEN
BY
Stryker & Jacobson
ATTORNEYS

United States Patent Office
3,385,773
Patented May 28, 1968

3,385,773
PROCESS FOR MAKING SOLID ELECTRICAL CONNECTION THROUGH A DOUBLE-SIDED PRINTED CIRCUIT BOARD

John J. Frantzen, St. Paul, Minn., assignor to Buckbee-Mears Company, St. Paul, Minn., a corporation of Minnesota Filed May 28, 1965, Ser. No. 459,664
2 Claims. (Cl. 204—16)

ABSTRACT OF THE DISCLOSURE

Holes are mechanically pierced completely through a single sided printed circuit laminate and then one end of the holes are closed up by attaching a metallic conductive layer to the exposed surface of the insulating layer. The holes are then filled with a conductive material by electroplating.

Figure 1:
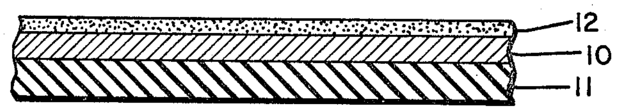

This invention relates generally to printed circuits and in particular to the manner of making electrical connection through the insulating layer between printed circuits on opposite sides of the insulating layer. It should be understood that the term "printed circuit" is used herein in its generic sense as relating to an electrical circuit made of flat conductors which are bonded to a supporting layer of a suitable insulating material and is independent of the process by which the circuit is formed which may be by stamping, etching, electroforming, etc.

In an effort to make electrical equipment which is constructed with printed circuits more compact, there was developed the multiple layer construction wherein alternate layers of printed circuits and insulation are stacked one on top of the other. A typical example of this is the double-sided printed circuit board in which independent electrical circuits are formed on the opposite sides or major surfaces of an intermediate supporting layer of insulation. One of the greatest difficulties encountered with the double-sided board has been the inability to achieve good reliable electrical connections between the circuits on the opposite sides of the board where necessary. Eyelets which pass through the insulating layer and are crimped on opposite ends of the respective circuits have been used but not too satisfactorily because the crimping operation has produced some relatively high resistance contacts and some unreliable connections. Soldering or spot welding the ends of the eyelets or a short rod which passes through the insulating layer to the respective circuits has also been tried. This has been costly because of the added steps and also the high temperature has in some instances delaminated the double-sided board at the interconnection points. There have been attempts to make the circuit interconnections over the edges of the boards but that has not been too successful because it places substantial limitations on the allowable layout pattern of the circuits, because it has been costly and because it has not produced the expected reliable electrical connections. Therefore, a principal object of this invention is to provide a process for making reliable, low resistance electrical connections between circuits on opposite sides of an insulating layer in a double-sided printed circuit board.

Still another object of this invention is to achieve the foregoing object without subjecting the board to potential damage by elevated temperatures.

As a feature of this invention, according to the process, the electrical connections between conducting layers on opposite sides of the double layer board are made in a predetermined pattern arrangement before the circuits themselves have been formed on their respective sides of the insulating layer. This provides for ready mass production of double-sided laminate for printed circuits which can then be used for making any of a variety of patterns of circuits as needed. This, of course, can result in a substantial reduction in the cost of preparing and processing the boards and achieves a standardization which may be highly desirable.

These and other advantages and features of this invention will become apparent during the course of the following detailed description with reference to the accompanying drawings in which FIGS. 1–4 partially illustrate a double-sided board as it may appear, in section, at various stages in the inventive process.

Initially, a layer of electrically conductive material 10, which may be, for example, ½ ounce or .002 inch thick copper, is bonded to one side of a suitable insulating layer 11 which may be flexible, such as Mylar, for example, or rigid such as epoxy board or the like. These and similar types of laminates are commercially available in a variety of weights, thicknesses, sizes, etc. depending on the contemplated use. The manner in which the laminate is formed is not considered part of the present invention. The upper or exposed surface of the conductive layer 10 is preferably then coated with a thin coating of photo-sensitive resist material or enamel 12, or any non-conductive material of a similar nature. The enamel may be applied by spraying, brushing, rolling, etc. and then is usually baked on to harden. The baking is done, of course, at a temperature below that which might harmfully affect the bond between the conducting layer 10 and the insulating layer 11. The reason that photosensitive material may be preferred is that it can likely be used later in forming the circuits themselves.

Figure 2:
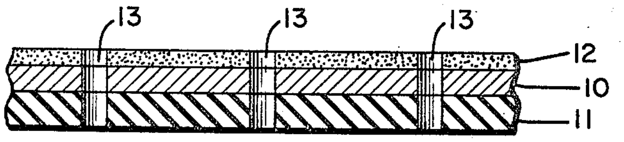

After the coating 12 has been allowed to set or harden, holes 13 passing completely through the entire sandwich structure of FIG. 1, are formed and appear illustrated in FIG. 2. The holes 13 can be formed in any convenient manner, preferably merely by suitable die punches. Preferably the holes are punched out in a predetermined pattern layout which may be, for example, at preselected intersections of a standardized grid of crossed lines. The manner of forming the holes and the locations thereof are, of course, a matter of choice, the essential thing being that the holes pierce cleanly and completely through the entire sandwich structure.

After the holes have been punched or otherwise formed, a layer of electrically conductive material 14, which may be similar to the copper layer 10, is attached to the bottom or exposed side of the insulating layer 11. The type of material, the layer thickness, etc. are all matters of choice depending upon the intended use. The conducting layer 14 can be bonded to the insulating layer 11 in any convenient manner. It has been found satisfactory to attach the conducting layer 14 to the insulating layer 11 with a very thin coating of adhesive which is preferably applied to the exposed bottom surface of the insulating layer 11 before the holes 13 are punched. This is to ensure that the adhesive does not get into the holes to adversely affect the later steps in the process. The bottom conducting layer 14 closes up one end of the previously formed holes 13.

Figure 3:
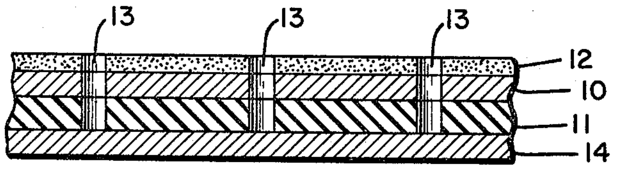
Figure 4:
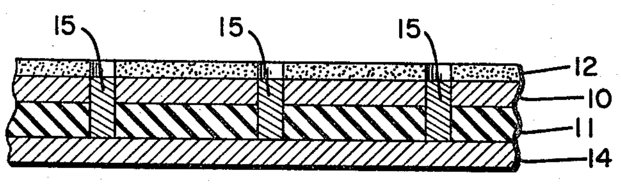

The structure to this point, as illustrated in FIG. 3, now becomes a workpiece in an electroplating process. The workpiece is immersed in a suitable electroplating bath with the proper electrical connection being made to the electrically conductive layer 14 in any convenient manner. Considering the workpiece as the cathode in the electroplating process, it is arranged so that the holes 13 face the anode. In other words, the insulating layers 11 and 12 along with the layer of conductive material 10 are between the conductive layer 14 and the anode in the electroplating bath. When the electroplating process is initiated, a suitable electrically conductive material leaves the anode and travels toward the conductive layer 14 in the well known manner. The only access route that this material has to layer 14 is through the various holes 13. The flow of material then follows these paths and starts to fill the holes 13 such as shown at 15 in FIG. 4. Since there is no electrical potential applied to the conductive layer 10, initially none of the material from the anode deposits upon the latter conductive layer and all of it continues to pile up in the holes 13 onto the conductive layer 14. However, once the holes have been filled through the insulating layer 11 up to the other conductive layer 10, the upper conductive layer 10 now becomes electrically connected to and at the same potential as the lower conductive layer 14 through the electrical connection of the material 15 which has partially filled the holes 13. Continuing the electroplating process after this point has been reached, results in the material being deposited both to continue filling the holes 13 and bonded to the inner cylindrical surface of the conductive layer 10 which defines an extension of the holes. It should be observed that since the enamel coating 12 covers the top surface of the conductive layer 10 the depositant is drawn to the layer 10 only through the holes in the enamel coating. The electroplating process is continued until the material builds up in the holes at least to the level of the enamel coating 12 and preferably even somewhat above that. It may be desirable, for example, that once the holes are filled to this level that the workpiece be temporarily removed from the electroplating bath and the circular areas which are void of the enamel 12 above the holes 13 be enlarged. Then, upon reimmersing the structure in the electrolytic bath, the depositant 15 will form into buttons on the layer 10 to achieve an even more solid electrical connection.

After this stage in the process, the laminated structure with the electrical connections therebetween can then be processed in any manner for whatever purpose intended. Generally this stage is followed by the actual forming of the printed circuits themselves out of the respective conductive layers 10 and 14 by etching or otherwise. If photoprinting steps are followed, the enamel coating 12 may be used. It should be noted that where it is desired to eliminate certain interconnections between circuits, all that need be done is to remove that portion of the conductive layer 10 or 14 which surrounds the hole area. This effectively opens the electrical connection so that there is no need to go through steps to completely remove the material 15 which fills the holes.

I claim:

1. A method for making solid electrical connection through a printed circuit board, comprising the steps of:
(a) punching holes which pierce completely through a laminate consisting of an insulating layer covered on one side only with a layer of electrically conductive material;
(b) closing one end of the holes by bonding a layer of electrically conductive material to the other side of the insulating layer; and
(c) filling the holes completely by electrodepositing with electrically conductive material which bonds to the electrically conductive layers on both sides of the insulating layer.

2. A method for making solid electrical connection through a printed circuit board, comprising the steps of:
(a) applying a thin coating of insulating material to the metal surface of a laminate consisting of a layer bonded to an insulating layer;
(b) mechanically piercing completely through the coated laminate to form a plurality of holes in a prearranged pattern;
(c) closing one end of the holes by bonding a metallic layer to the uncoated side of the laminate; and
(d) electrodepositing electrically conductive material on the latter metallic layer through the holes until the holes are completely filled to at least the level of the thin coating layer.

References Cited

UNITED STATES PATENTS

| | | | |
|---|---|---|---|
| 3,099,608 | 7/1963 | Radousky | 204—15 |
| 3,163,588 | 12/1964 | Shortt et al. | 204—16 |
| 3,171,796 | 3/1965 | Stephens et al. | 204—15 |
| 3,208,921 | 9/1965 | Hill | 204—15 |
| 3,311,966 | 4/1967 | Shaheen et al. | 29—625 |
| 3,319,317 | 5/1967 | Roche et al. | 204—15 |

JOHN H. MACK, *Primary Examiner.*

ROBERT K. MIHALEK, *Examiner.*

T. TUFARIELLO, *Assistant Examiner.*